(12) United States Patent
Xie et al.

(10) Patent No.: US 10,562,721 B2
(45) Date of Patent: Feb. 18, 2020

(54) FEEDER AND BACKLIGHT PRODUCTION APPARATUS

(71) Applicant: BOE TECHNOLOGY GROUP CO., LTD., Beijing (CN)

(72) Inventors: Jiabin Xie, Beijing (CN); Yangyang Wang, Beijing (CN); Zailin Hong, Beijing (CN); Xiaoguang Hong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 44 days.

(21) Appl. No.: 15/928,655

(22) Filed: Mar. 22, 2018

(65) Prior Publication Data
US 2019/0092589 A1   Mar. 28, 2019

(30) Foreign Application Priority Data

Sep. 28, 2017  (CN) .................... 2017 2 1257681 U

(51) Int. Cl.

| B01L 9/00 | (2006.01) |
|---|---|
| G01N 35/02 | (2006.01) |
| B65G 59/10 | (2006.01) |
| B65H 3/08 | (2006.01) |
| B65H 15/00 | (2006.01) |
| H05K 13/04 | (2006.01) |

(52) U.S. Cl.
CPC ......... *B65G 59/106* (2013.01); *B65H 3/0808* (2013.01); *B65H 15/00* (2013.01); *H05K 13/0434* (2013.01); *B65H 2301/332* (2013.01)

(58) Field of Classification Search
CPC .. B65G 59/062; B65G 59/06; B65G 2207/46; B65G 59/02; G01R 31/01; G01R 31/2851; G01R 31/2893; B65B 43/44; B65H 15/00
See application file for complete search history.

(56) References Cited

U.S. PATENT DOCUMENTS

| 2,255,705 A | * | 9/1941 | Hare | .................... | B65G 47/252 |
|---|---|---|---|---|---|
| | | | | | 198/381 |
| 3,567,008 A | * | 3/1971 | Fischer | .................. | B65G 47/24 |
| | | | | | 198/402 |
| 3,759,303 A | * | 9/1973 | Henrichs | ................. | B65B 43/44 |
| | | | | | 141/1 |

(Continued)

FOREIGN PATENT DOCUMENTS

CN    105750863 A    7/2016

*Primary Examiner* — Gregory W Adams
(74) *Attorney, Agent, or Firm* — Nath, Goldberg & Meyer; Joshua B. Goldberg; Stephanie Majkut

(57) ABSTRACT

The present disclosure provides a feeder and a backlight production apparatus. The feeder includes: a storing assembly configured to store a material tray on which a plurality of elements to be fed are placed; a fetching assembly configured to obtain the material tray from the storing assembly by sucking and transport the material tray; a distributing assembly configured to obtain at least one element to be fed by sucking from the material tray transported by the fetching assembly, and distribute the at least one element to be fed; and a turn-over assembly configured to turn over the at least one element to be fed distributed by the distributing assembly, and transport the at least one element to be fed to a next process unit.

13 Claims, 7 Drawing Sheets

(56) References Cited

U.S. PATENT DOCUMENTS

| | | | | |
|---|---|---|---|---|
| 3,958,740 | A * | 5/1976 | Dixon | H01L 21/67144 |
| | | | | 228/102 |
| 4,630,812 | A * | 12/1986 | Yano | B65H 3/122 |
| | | | | 271/132 |
| 5,664,322 | A * | 9/1997 | Best | B23P 21/004 |
| | | | | 221/297 |
| 5,807,066 | A * | 9/1998 | Smith | G01R 31/01 |
| | | | | 414/416.01 |
| 5,906,472 | A * | 5/1999 | Nakamura | H05K 13/0061 |
| | | | | 414/798.1 |
| 6,008,476 | A * | 12/1999 | Neiconi | B23K 37/047 |
| | | | | 219/388 |
| 6,966,744 | B1 * | 11/2005 | Cho | B65G 57/035 |
| | | | | 414/795.3 |
| 6,982,063 | B2 * | 1/2006 | Hamel | G01N 35/028 |
| | | | | 422/511 |
| 7,778,727 | B2 * | 8/2010 | Kanno | G01R 31/2893 |
| | | | | 414/222.02 |
| 8,118,531 | B2 * | 2/2012 | Watanabe | H05K 13/0439 |
| | | | | 269/254 CS |
| 8,627,997 | B2 * | 1/2014 | Cheung | B23K 1/018 |
| | | | | 228/191 |
| 2014/0234068 | A1 * | 8/2014 | Beressey | B65G 59/105 |
| | | | | 414/798 |

\* cited by examiner

FEEDER AND BACKLIGHT PRODUCTION APPARATUS

CROSS-REFERENCE TO RELATED APPLICATION

This application claims the priority of Chinese Patent Application No. 201721257681.5 submitted to the Chinese Intellectual Property Office on Sep. 28, 2017, the disclosure of which is incorporated herein in its entirety by reference.

TECHNICAL FIELD

The present disclosure relates to the technical field of display technology, and particularly relates to a feeder and a backlight production apparatus.

BACKGROUND OF THE INVENTION

When storing a semi-finished product during the production of backlight, the backlight is usually arranged with the front side facing downward and the back side facing upward, so as to prevent dusts and foreign matters in the air entering a surface of the backlight and polluting the backlight.

Current feeding is typically carried out by manual through the following procedures: an operator takes single semi-finished product out of a material tray, turns it over manually before putting it on an assembly line of a film laminating machine, and allows the film laminating machine to complete the subsequent assembly of film materials. In this way, one film laminating machine requires one fixed feeding operator who needs to feed ten thousands of times per day. Besides, defects such as scratches in the semi-finished product are unavoidable during the feeding process, especially when the operator is tired and touches a screen region of the backlight with a finger by accident, which will result in defects including white shadow and white dots.

It can be seen that the current feeding method for backlight is low in productivity and may cause defects in the backlight product. Therefore, there is an urgent need for a device that can realize automatic feeding of backlight.

SUMMARY

The present disclosure has been accomplished in order to at least partially solve the problems in the prior art. The present disclosure provides a feeder that can realize automatic feeding of backlight.

According to one aspect of the disclosure, there is provided a feeder, comprising:

a storing assembly configured to store a material tray on which a plurality of elements to be fed are placed;

a fetching assembly configured to obtain the material tray from the storing assembly by sucking and transport the material tray;

a distributing assembly configured to obtain at least one element to be fed by sucking from the material tray transported by the fetching assembly, and distribute the at least one element to be fed; and a turn-over assembly configured to turn over the at least one element to be fed distributed by the distributing assembly, and transport the at least one element to be fed to a next process unit.

The storing assembly may include:

a storing platform configured to support the plurality of material trays in a stack; and a storing support member configured to lift the material trays and allow one and only one of the material trays to fall below the storing platform at a time.

The storing assembly may further include:

a plurality of storing pillars respectively disposed over an edge of the storing platform and configured to regulate stacking of the plurality of material trays.

The storing support member may include a pair of cylinders that are disposed over opposite edges of the storing platform and extended/retracted with respect to the edges of the storing platform according to a position of the material tray to separate the lowest material tray so that the lowest material tray falls below the storing platform.

The fetching assembly may include:

a fetching guide rail disposed at least partially below the storing platform and extended to at least a position joining the distributing assembly; a material tray lift member disposed on the fetching guide rail and configured to move up and down in a vertical direction:

a material tray transport motor disposed at an end of the fetching guide rail and configured to allow the material tray lift member to move along the fetching guide rail; and a material tray support member disposed on top of the material tray lift member, moved to or away from the storing platform as the material tray lift member is moved up and down in the vertical direction, and configured to receive and suck the material tray from the storing assembly.

The material tray support member may include:

a material tray suction nozzle;

a suction nozzle pallet configured to support the material tray suction nozzle;

a material tray pallet disposed over and in parallel to the suction nozzle pallet and configured to support the material tray from the storing assembly, wherein the material tray pallet is provided with a suction nozzle hole at a position corresponding to the material tray suction nozzle, and a top end of the material tray suction nozzle passes through the suction nozzle hole so that the material tray is sucked and fixed on an upper surface of the material tray pallet; and an evacuating means for material fetching connected to the material tray suction nozzle so that the material tray suction nozzle is switchable between a vacuum sucking state and a non-sucking state.

The distributing assembly may include:

a distributing guide rail configured to interface with a fetching guide rail of the fetching assembly;

a distributing lift member disposed on the distributing guide rail and configured to suck the at least one element to be fed and move the at least one element to be fed in a vertical direction; and a distributing motor disposed at an end of the distributing guide rail and configured to allow the distributing lift member to move along the distributing guide rail.

The distributing lift member may include:

a distributing bracket which is movable up and down in a vertical direction and provided with at least one air channel in communication with each other therein:

at least one distributing suction nozzle, which is disposed on top of the distributing bracket and connected to a corresponding air channel, and is configured to take the at least one element to be fed in the same row or column out of the material tray and onto the turn-over assembly; and an evacuating means for material distribution which is in communication with the distributing suction nozzle via the air channel so that the distributing suction nozzle is switchable between a vacuum sucking state and a non-sucking state.

The turn-over assembly may include:

a transport member configured to transport the at least one element to be fed; and a turn-over baffle, which is disposed at a side of and spaced apart from the transport member, and is configured to receive the at least one element to be fed falling off the transport member and allow the at least one element to be fed to be turned over.

A distance between the transport member and the turn-over baffle satisfies: $0.5L<S1<L$, where L is a length of the element to be fed, S1 is a vertical distance from a tangent point of a circular arc at an end of the transport member to a plane of the turn-over baffle.

An angle between the turn-over baffle and a horizontal plane of the transport member is in the range of 45°~60°.

The feeder may further include: a material tray recovery assembly, which is configured to recover a vacant material tray and to which the fetching assembly is further configured to transport the vacant material tray, the material tray recovery assembly includes:

a material tray recovery platform configured to support the plurality of material trays in a stack; and a material tray recovery support member configured to lift the material trays and allow one and only one of the material trays below the material tray recovery platform to be raised to the material tray recovery platform at a time.

The material tray recovery assembly may further include:

a plurality of material tray recovery pillars respectively disposed over an edge of the material tray recovery platform and configured to regulate stacking of the plurality of material trays.

The material tray recovery support member may include a pair of flat springs disposed over opposite edges of the material tray recovery platform, the flat springs bounce up or block levelly relative to a plane of the material tray recovery platform according to a position of the material tray so that the material tray is raised from below the material tray recovery platform to the material tray recovery platform.

According to another aspect of the disclosure, there is provided a backlight production apparatus comprising the above feeder, wherein the element to be fed is a backlight.

DETAILED DESCRIPTION

To improve understanding of the technical solution of the present disclosure for those skilled in the art, the present disclosure will be described in detail in conjunction with the accompanying drawings and specific embodiments.

First Exemplary Embodiment

According to one aspect of the disclosure, this exemplary embodiment provides a feeder.

Figure 1:
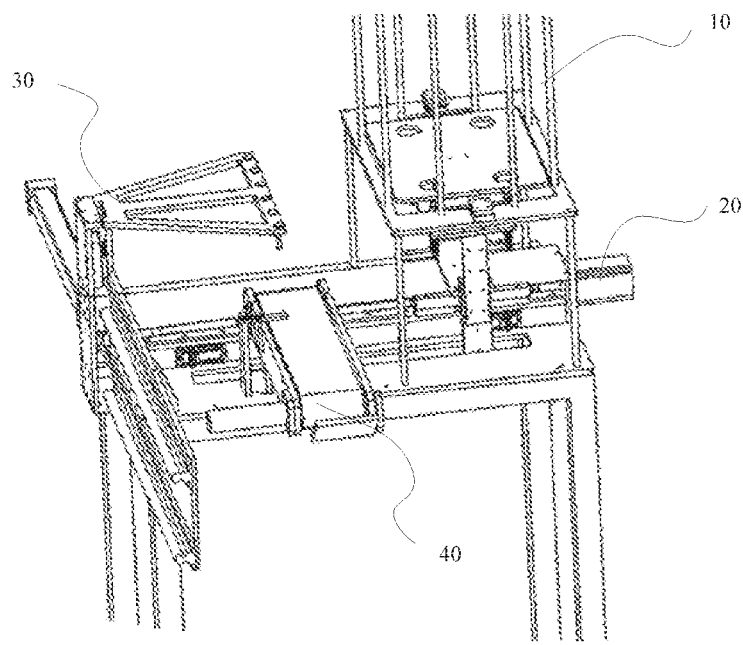
FIG. 1 is a schematic view showing an overall structure of a feeder according to the first exemplary embodiment of the disclosure.

As shown in FIG. 1, the feeder includes: a storing assembly 10, which is configured to store a material tray on which a plurality of elements to be fed are placed; a fetching assembly 20, which is configured to obtain the material tray from the storing assembly 10 by sucking and transport the material tray; a distributing assembly 30, which is configured to obtain at least one element to be fed by sucking from the material tray transported by the fetching assembly 20, and distribute the at least one element to be fed; and a turn-over assembly 40, which is configured to turn over the at least one element to be fed distributed by the distributing assembly 30, and transport the at least one element to be fed to a next process unit.

Through the automatic cooperation of the storing assembly 10, fetching assembly 20, distributing assembly 30 and turn-over assembly 40, the feeder realizes automatic feeding, thus improving efficiency and guaranteeing yield.

Figure 2:
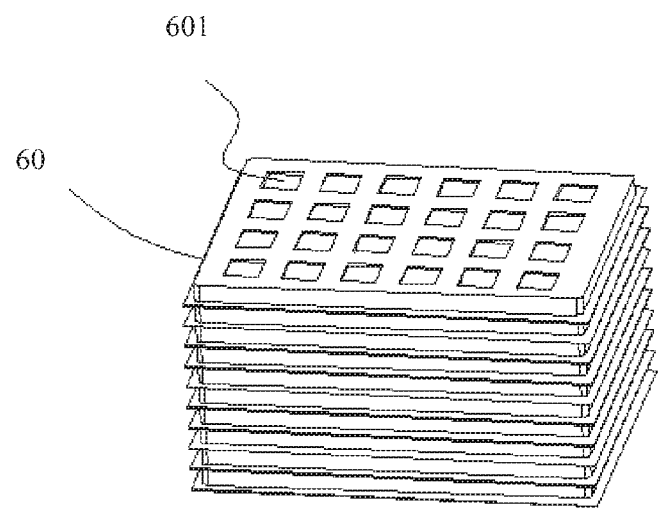
FIG. 2 is a schematic view showing a plurality of material trays in a stack.

As shown in FIG. 2, a plurality of material trays 60 are placed in a stack, and a plurality of elements to be fed 601 are placed in each material tray 60.

Hereafter, each of the above assemblies of the feeder will be explained in detail.

The storing assembly may be provided with material trays 60 in FIG. 2 which are supported by a storing support member.

Figure 3:
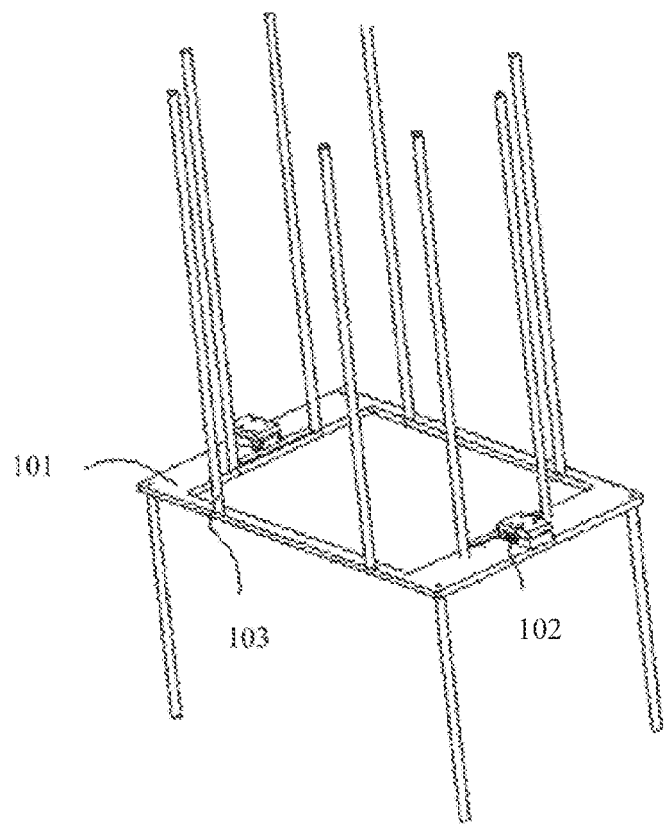
FIG. 3 is a structural schematic view of the storing assembly in FIG. 1.

In the exemplary embodiment, as shown in FIG. 3, the storing assembly 10 includes a storing platform 101 and a storing support member 102. The storing platform 101 is configured to support the plurality of material trays 60 in a stack. The storing support member 102 is configured to lift the material trays 60 and allow one and only one of the material trays 60 to fall below the storing platform 101 at a time.

The storing assembly 10 realizes automatic separation and fall of the material tray 60 through the storing support member 102. The storing support member 102 includes a pair of cylinders that are disposed over opposite edges of the storing platform 101 and extended/retracted with respect to the edges of the storing platform 101 according to a position of the material tray 60 to separate the lowest material tray 60 so that the lowest material tray falls below the storing platform 101.

In the exemplary embodiment, the storing assembly 10 further includes a plurality of storing pillars 103, which are respectively disposed over an edge of the storing platform 101 and configured to regulate stacking of the plurality of material trays 60. By means of the storing pillars 103, the stacking of the plurality of material trays 60 and thus mechanized batch operations are realized.

Figure 3A:
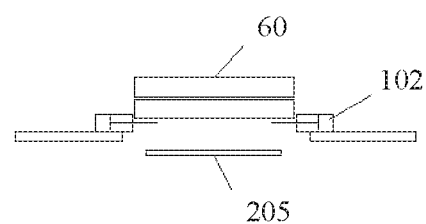
FIGS. 3A-3B are schematic views showing the falling process of the material tray in the storing assembly of FIG. 3.
Figure 3B:
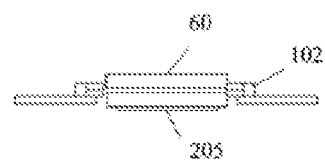

Hereafter, the falling process of the material tray 60 will be explained in detail with reference to FIGS. 3A-3B.

It should be understood that when two material trays 60 are stacked together, there is a gap between them. When a new material tray 60 filled with products is to be fetched, a material tray pallet 205, driven by other members, is moved to a position near the material tray 60 (as shown in FIG. 3A). Then, the storing support member 102 is retracted so that the lowest material tray 60 loses support and falls onto the material tray pallet 205 (as shown in FIG. 3B). Next, the storing support member 102 is extended to re-support a penultimate material tray 60 while the falling material tray 60 is moved to another position driven by the material tray pallet 205.

Figure 4:
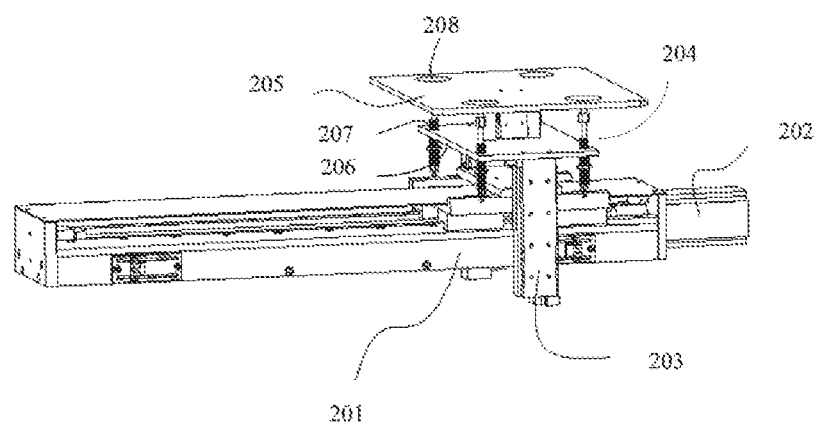
FIG. 4 is a structural schematic view of the fetching assembly in FIG. 1.

The fetching assembly 20 realizes transport of the material tray 60. In the exemplary embodiment, as shown in FIG. 4, the fetching assembly 20 includes a fetching guide rail 201, a material tray transport motor 202, a material tray lift member 203 and a material tray support member 204. The fetching guide rail 201 is disposed at least partially below the storing platform 101 and extended to at least a position joining the distributing assembly 30. The material tray transport motor 202 is disposed at an end of the fetching guide rail 201 and configured to allow the material tray lift member 203 to move along the fetching guide rail 201. The material tray lift member 203 is disposed on the fetching guide rail 201 and configured to allow the material tray support member 204 to move up and down in a vertical direction so as to move to or away from the storing platform 101. The material tray support member 204 is disposed on top of the material tray lift member 203 and configured to receive and suck the material tray 60 from the storing assembly 10.

In the exemplary embodiment, the material tray support member 204 includes a material tray pallet 205, an evacuating means for material fetching, a suction nozzle pallet 206 and a material tray suction nozzle 207. The material tray pallet 205 is disposed in parallel to the suction nozzle pallet 206 and configured to support the material tray 60 from the storing assembly 10. The suction nozzle pallet 206 movable up and down in a vertical direction is disposed below the material tray pallet 205 and configured to support the material tray suction nozzle 207. The material tray pallet 205 is provided with a suction nozzle hole 208 at a position corresponding to the material tray suction nozzle 207, and a top end of the material tray suction nozzle 207 passes through the suction nozzle hole 208 so that the material tray 60 is sucked and fixed on an upper surface of the material tray pallet 205. The evacuating means for material fetching is connected to the material tray suction nozzle 207 so that the material tray suction nozzle 207 is in a vacuum sucking state or a non-sucking state.

In the fetching assembly 20, when the material tray lift member 203 is moved up, the material tray suction nozzle 207 sucks a bottom of the material tray 60 and the material tray 60 is supported by the material tray pallet 205. Then, the material tray lift member 203 is moved down, and the material tray transport motor 202 drives the material tray lift member 203 so that the material tray 60 is advanced to the distributing assembly 30.

Figure 5:
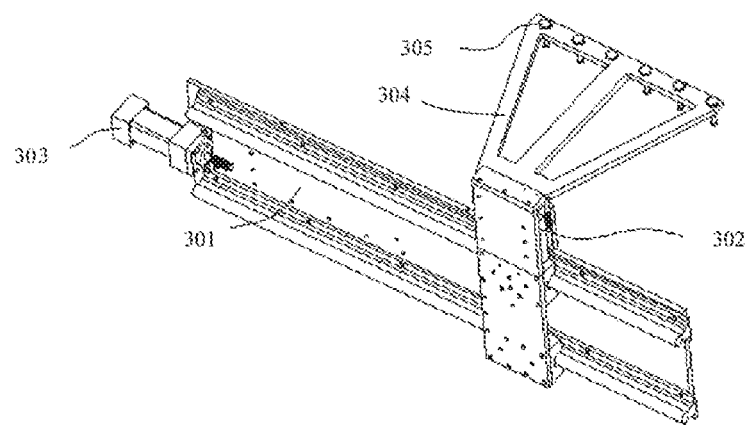
FIG. 5 is a structural schematic view of the distributing assembly in FIG. 1.

The distributing assembly 30 has a structure that can realize automatic distribution. In the exemplary embodiment, as shown in FIG. 5, the distributing assembly 30 includes a distributing guide rail 301, a distributing lift member 302 and a distributing motor 303. The distributing guide rail 301 is configured to interface with the fetching guide rail 201 so as to allow the distributing lift member 302 to suck an element to be fed 601 from the fetching assembly 20. The distributing motor 303 is disposed at an end of the distributing guide rail 301 so as to allow the distributing lift member 302 to move along the distributing guide rail 301. The distributing lift member 302 is disposed on the distributing guide rail 301 and configured to suck the element to be fed 601 and allow the element to be fed 601 to move in a vertical direction.

The distributing lift member 302 can realize automatic distribution. In the exemplar) embodiment, the distributing lift member 302 includes an evacuating means for material distribution, a distributing bracket 304 and a distributing suction nozzle 305. The distributing bracket 304 is movable up and down in a vertical direction and provided with air channels in communication with each other therein. The distributing suction nozzle 305 is disposed on top of the distributing bracket 304 and connect to a corresponding air channel, and is configured to take one or more elements to be fed 601 in the same row or column out of the material tray 60 and onto the turn-over assembly 40, wherein the number of the distributing suction nozzles 305 may be one or more so as to correspond to the number of elements to be fed 601 to be sucked at a time. The evacuating means for material distribution is in communication with the distributing suction nozzle 305 via the air channel so that the distributing suction nozzle 305 is in a vacuum sucking state or a non-sucking state.

In the distributing assembly 30, the distributing suction nozzle 305 may suck the element to be fed 601 in the material tray 60, and then lift the element to be fed 601 away from the material tray 60 through the distributing lift member 302 before transporting the element to be fed 601 onto the turn-over assembly 40 by the distributing motor 303.

Figure 6:
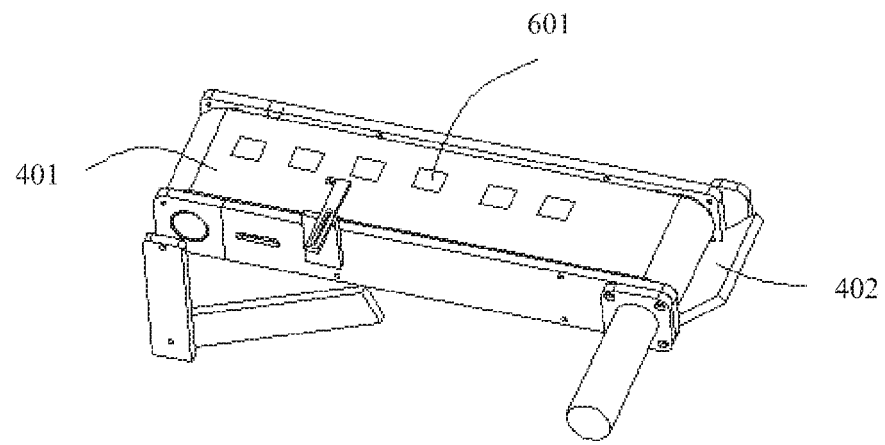
FIG. 6 is a structural schematic view of the turn-over assembly in FIG. 1.

The turn-over assembly 40 can realize automatic turnover. In the exemplar) embodiment, as shown in FIG. 6, the turn-over assembly 40 includes a transport member 401 and a turn-over baffle 402. The turn-over baffle 402 is disposed at a side of and spaced apart from the transport member 401, and is configured to receive the element to be fed 601 falling off the transport member 401 and allow the element to be fed 601 to be turned over. The element to be fed 601 on the transport member 401 is initially in a backside up state. Once the element to be fed 601 is transported to an end of the transport member 401 via the transport member 401 and falls onto the turn-over baffle 402, the element to be fed 601 will become face up. In this case, the face up element to be fed 601 can be used by other production apparatus.

Figure 7:
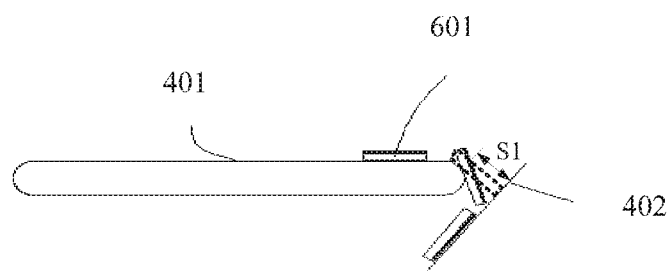
FIG. 7 is a schematic diagram of the turn-over assembly in FIG. 1.

In the exemplary embodiment, to ensure automatic and effective turnover of the element to be fed 601 without getting the element to be fed 601 stuck or fall to the ground, as shown in FIG. 7, a distance between the transport member 401 and the turn-over baffle 402 satisfies: $0.5L < S1 < L$, where L is a length of the element to be fed 601, S1 is a vertical distance from a tangent point of a circular arc at an end of the transport member 401 to a plane of the turn-over baffle 402. The element to be fed 601 may be seen as a cuboid, and the center of gravity is roughly the geometric center of the cuboid. The element to be fed 601 will fall off only when the center of gravity of the product exceeds the transport member 401. Then, if $S1 < 0.5L$, the product will get stuck and cannot fall off and turn over smoothly. Therefore, in the exemplary embodiment, when the element to be fed 601 is perpendicular to the turn-over baffle 402, it satisfies $0.5L < S1 < L$.

In the exemplary embodiment, an angle between the turn-over baffle 402 and a horizontal plane of the transport member 401 is in the range of 45°~60° so as to ensure the actual turnover to be gentler to protect the element to be fed 601.

The transport member 401 is a belt, and positions of the turn-over baffle and the belt are relatively fixed. In the exemplary embodiment, the transport member 401 has a speed less than or equal to about 0.2 m/s. The transport member 401 maintaining a steady speed without fluctuations is beneficial for ensuring that the element to be fed 601 can be turned over and will not get stuck.

It should be understood that, in FIG. 1, the fetching assembly 20 is inserted between the storing assembly 10, the distributing assembly 30 and the turn-over assembly 40, which provides a compact feeder that allows the feeder of the disclosure to be adapted to a more limited space. In other applications, the storing assembly 10, fetching assembly 20, distributing assembly 30 and turn-over assembly 40 may also be arranged in a line or in other shapes to facilitate operations. The specific arrangement is not limited herein.

The operation procedures of the feeder include:

Placing, by an operator, the material trays 60 in a stack shown in FIG. 2 into the storing assembly 10, and, in an initial state, disposing the material tray lift member 203 directly below the storing assembly 10;

when the feeder is initiated, moving the material tray lift member 203 up, and, by the material tray suction nozzle 207, sucking a bottom of the material tray 60 to suck the lowest material tray 60 in the storing assembly 10 out and onto the material tray pallet 205;

then, moving the material tray lift member 203 down, and operating the material tray transport motor 202 to transport a first row of elements to be fed 601 on the material tray 60 to directly below the distributing suction nozzle 305;

next, moving the distributing lift member 302 down, and, by the distributing suction nozzle 305, sucking the first row of elements to be fed 601 at a time and transporting them onto the turn-over assembly 40:

then, operating the material tray transport motor 202 again to transport a second row of elements to be fed 601 on the material tray 60 to directly below the distributing suction nozzle 305, and repeating the process sequentially until all of the elements to be fed 601 on the material tray 60 are sucked and transported onto the turn-over assembly 40;

removing a vacant material tray by the operator or making the vacant material tray free fall to the ground to recover it:

then, restoring the fetching assembly 20 to be in the initial state, i.e., directly below the storing assembly 10, for next cycle until all of the material trays 60 in the storing assembly 10 are taken out.

The feeder can realize automatic feeding and turnover of materials, solve the technical problem with defects in the element to be fed and low efficiency caused by manual operation in feeding of the element to be fed, and thus effectively improve the productivity and ensure the product yield.

Second Exemplary Embodiment

According to another aspect of the disclosure, this exemplary embodiment provides another feeder that can realize not only automatic feeding and turnover of materials but also automatic recovery of vacant material trays.

Figure 8:
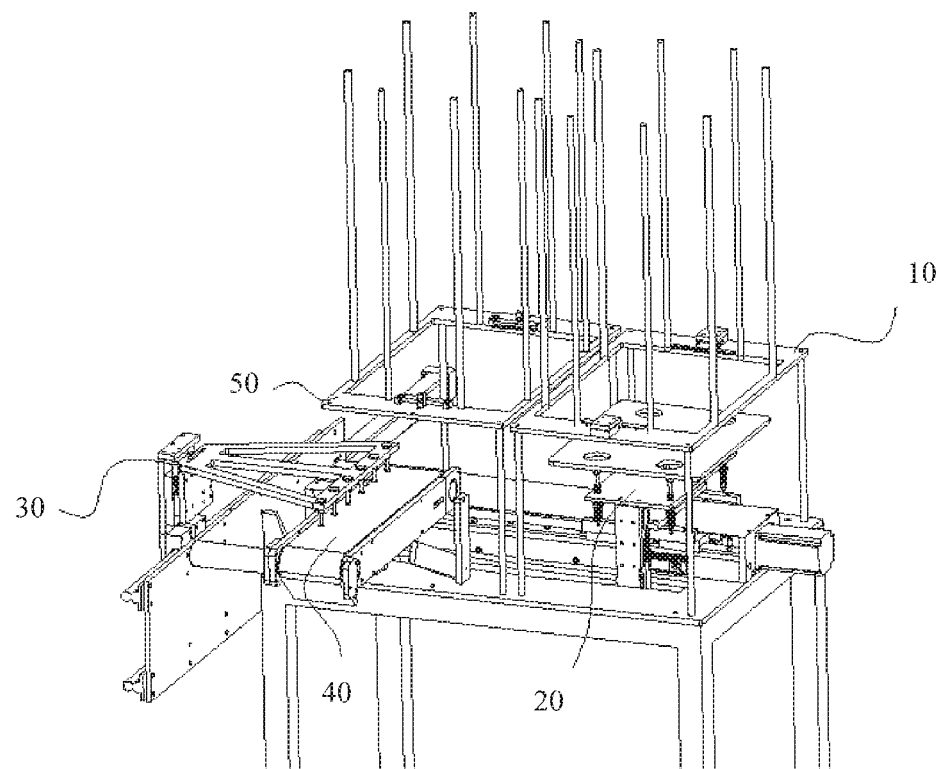
FIG. 8 is a schematic view showing an overall structure of a feeder according to the second exemplary embodiment of the disclosure.

As shown in FIG. 8, besides the storing assembly 10, fetching assembly 20, distributing assembly 30 and turn-over assembly 40 as the first exemplary embodiment, the feeder further includes a material tray recovery assembly 50.

In the exemplary embodiment, the material tray recovery assembly 50 is used to recover a vacant material tray 60, and the fetching assembly 20 is further configured to transport the vacant material tray 60 to the material tray recovery assembly 50. When the material tray 60 has no element to be fed 601 therein, the vacant material tray 60 will be recovered into the material tray recovery assembly 50.

Figure 9:
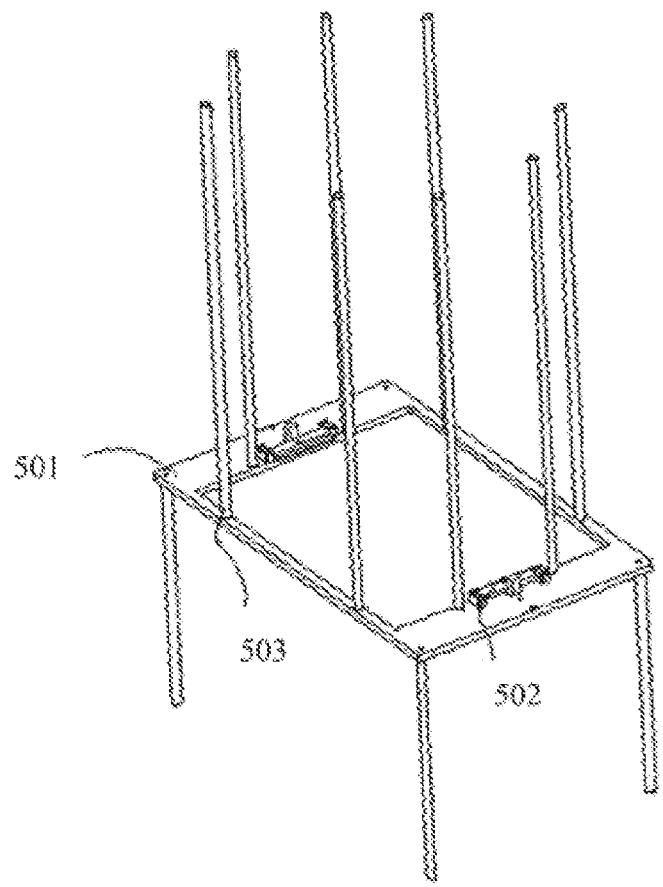
FIG. 9 is a structural schematic view of the material tray recovery assembly in FIG. 8.

As shown in FIG. 9, the material tray recovery assembly 50 includes a material tray recovery platform 501 and a material tray recovery support member 502. The material tray recovery platform 501 is configured to support a plurality of material trays 60 in a stack. The material tray recovery support member 502 is configured to lift the material trays 60 and allow one and only one of the material trays 60 below the material tray recovery platform 501 to be raised to the material tray recovery platform 501 at a time.

The material tray recovery support member 502 can realize automatic recovery of the material tray 60. In the exemplary embodiment, the material tray recovery support member 502 includes a pair of flat springs disposed over opposite edges of the material tray recovery platform 501. The flat springs bounce up or block levelly relative to a plane of the material tray recovery platform 501 according to a position of the material tray 60 so that the material tray 60 is raised from below the material tray recovery platform 501 to the material tray recovery platform 501.

In the exemplary embodiment, the material tray recovery assembly 50 further includes a plurality of material tray recovery pillars 503, which are disposed over an edge of the material tray recovery platform 501 and configured to regulate stacking of the plurality of material trays.

Hereafter, the recovery process of the vacant material tray will be explained in detail with reference to FIGS. 9A-9E.

Figure 9A:
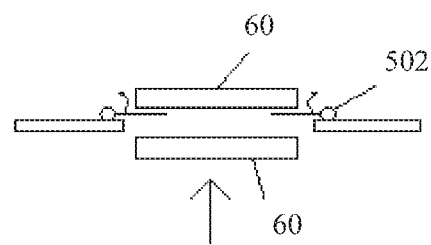
FIGS. 9A-9E are schematic views showing the process of recovering a material tray by the material tray recovery assembly in FIG. 9.
Figure 9B:
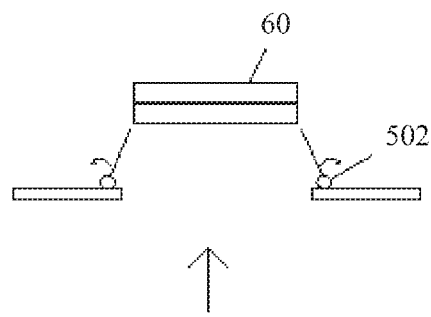
Figure 9C:
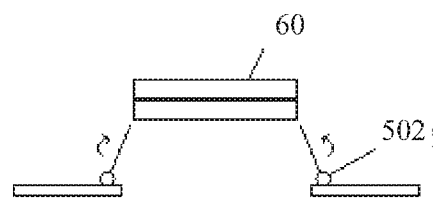
Figure 9D:
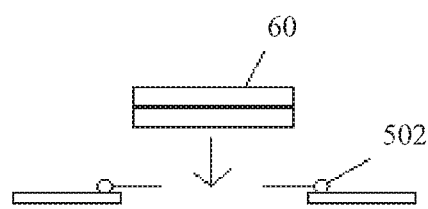
Figure 9E:
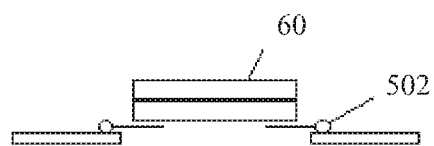

A vacant material tray 60 moving up (as shown in FIG. 9A) will drive the material tray recovery support member 502 to rotate (as shown in FIG. 9B), and when the material tray 60 is moved away from the material tray recovery support member 502, the material tray recovery support member 502 will freely fall under its own gravity (as shown in FIG. 9C), and then the material tray 60 stops moving up and begins moving down to finally rest on the material tray recovery support member 502 (as shown in FIGS. 9D and 9E).

The operation procedures of the feeder include:

placing, by an operator, the material trays 60 in a stack shown in FIG. 2 into the storing assembly 10, and, in an initial state, disposing the material tray lift member 203 directly below the storing assembly 10;

when the feeder is initiated, moving the material tray lift member 203 up, and, by the material tray suction nozzle 207, sucking a bottom of the material tray 60 to suck the lowest material tray 60 in the storing assembly 10 out and onto the material tray pallet 205;

then, moving the material tray lift member 203 down, and operating the material tray transport motor 202 to transport a first row of elements to be fed 601 on the material tray 60 to directly below the distributing suction nozzle 305;

next, moving the distributing lift member 302 down, and, by the distributing suction nozzle 305, sucking the first row of elements to be fed 601 at a time and transporting them onto the turn-over assembly 40;

then, operating the material tray transport motor 202 again to transport a second row of elements to be fed 601 on the material tray 60 to directly below the distributing suction nozzle 305, and repeating the process sequentially until all of the elements to be fed 601 on the material tray 60 are sucked and transported onto the turn-over assembly 40;

then, operating the material tray transport motor 202 to transport the vacant material tray 60 to below the material tray recovery assembly 50, and moving the material tray lift member 203 up to insert the vacant material tray 60 into the material tray recovery assembly 50 upward from below;

then, restoring the fetching assembly 20 to be in the initial state. i.e., directly below the storing assembly 10, for next cycle until all of the material trays 60 in the storing assembly 10 are taken out.

The feeder can realize automatic feeding and turnover of materials as well as automatic recovery of vacant material trays, solve the technical problem with defects in the element to be fed and low efficiency caused by manual operation in feeding of the element to be fed, and thus effectively improve the productivity and ensure the product yield.

Third Exemplary Embodiment

According to still another aspect of the disclosure, the exemplary embodiment provides a backlight production apparatus comprising the feeder in the first or second exemplary embodiment, wherein the element to be fed 601 is a backlight.

Compared with conventional manual feeding, the feeder of the disclosure has the following advantages:

manpower saving: the operator only needs to put a stack of material trays in the storing assembly 10 of the feeder at a time to realize automatic feeding without a need of seeing to it all the time, and thus one operator can operate multiple machines at the same time;

high feeding efficiency: a plurality of semi-finished backlight products may be taken out of the material tray at a time (in conventional operation, the operator takes one semi-finished backlight product out of the material tray at a time), resulting a higher efficiency;

automatic recovery of the material tray: the feeder of the disclosure has a function of automatically recovering vacant material trays, and the recovered material trays are automatically stacked neatly to be taken away easily (in conventional manner, the vacant material trays needs to be stacked manually, which will affect the overall feeding speed);

high yield: there is no need for an operator to stay around, and the device is in excellent cleanness; thus for products with high demands for environment cleanness such as backlight, defects caused by dusts are reduced, and defects caused by the operator are avoided (in conventional manner, a tired operator touching a screen region of the backlight with a finger by accident will cause defects including white shadow and white dots).

The feeder can automatically grasp single material tray and a semi-finished backlight product in the material tray onto the turn-over assembly so that the turn-over assembly turns over the material to make it face up. Once the semi-finished backlight product in the material tray is grasped, the vacant material tray will be automatically recovered into the material tray recovery assembly. The feeder is especially adapted to automatic feeding of backlight with a smaller size of 1-3 inches, and thus effectively solves the technical problem with manual feeding in the production of such backlight and saves manpower.

It should be understood that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A feeder comprising:
a storing assembly comprising a storing platform and configured to store a material tray on which a plurality of elements to be fed are placed;
a fetching assembly configured to obtain the material tray from the storing assembly by sucking and transport the material tray;
a distributing assembly configured to obtain at least one element to be fed by sucking from the material tray transported by the fetching assembly, and distribute the at least one element to be fed; and
a turn-over assembly configured to turn over the at least one element to be fed distributed by the distributing assembly, and transport the at least one element to be fed to a next process unit,
wherein the fetching assembly comprises:
a fetching guide rail disposed at least partially below the storing platform and extended to at least a position joining the distributing assembly;
a material tray lift member disposed on the fetching guide rail and configured to move up and down in a vertical direction;
a material tray transport motor disposed at an end of the fetching guide rail and configured to allow the material tray lift member to move along the fetching guide rail; and
a material tray support member disposed on top of the material tray lift member, moved to or away from the storing platform as the material tray lift member is moved up and down in the vertical direction, and configured to receive and suck the material tray from the storing assembly,
wherein the material tray support member comprises:
a material tray suction nozzle;
a suction nozzle pallet configured to support the material tray suction nozzle;
a material tray pallet disposed over and in parallel to the suction nozzle pallet and configured to support the material tray from the storing assembly, wherein the material tray pallet is provided with a suction nozzle hole at a position corresponding to the material tray suction nozzle, and a top end of the material tray suction nozzle passes through the suction nozzle hole so that the material tray is sucked and fixed on an upper surface of the material tray pallet; and
an evacuating means for material fetching connected to the material tray suction nozzle so that the material tray suction nozzle is switchable between a vacuum sucking state and a non-sucking state.

2. The feeder of claim 1,
wherein the storing platform is configured to support a plurality of material trays in a stack; and the storing assembly further comprises:
a storing support member configured to lift the material trays and allow one and only one of the material trays to fall below the storing platform at a time.

3. The feeder of claim 2,
wherein the storing assembly further comprises:
a plurality of storing pillars respectively disposed over an edge of the storing platform and configured to regulate stacking of the plurality of material trays.

4. The feeder of claim 2,
wherein the storing support member comprises a pair of cylinders that are disposed over opposite edges of the storing platform and extended/retracted with respect to the edges of the storing platform according to a position of the material tray to separate the lowest material tray so that the lowest material tray falls below the storing platform.

5. The feeder of claim 1,
wherein the distributing assembly comprises:
a distributing guide rail configured to interface with a fetching guide rail of the fetching assembly;
a distributing lift member disposed on the distributing guide rail and configured to suck the at least one element to be fed and move the at least one element to be fed in a vertical direction; and
a distributing motor disposed at an end of the distributing guide rail and configured to allow the distributing lift member to move along the distributing guide rail.

6. The feeder of claim 5,
wherein the distributing lift member comprises:
a distributing bracket which is movable up and down in a vertical direction and provided with at least one air channel in communication with each other therein;
at least one distributing suction nozzle, which is disposed on top of the distributing bracket and connected to a corresponding air channel, and is configured to take the at least one element to be fed in the same row or column out of the material tray and onto the turn-over assembly; and
an evacuating means for material distribution which is in communication with the distributing suction nozzle via the air channel so that the distributing suction nozzle is switchable between a vacuum sucking state and a non-sucking state.

7. The feeder of claim 1,
wherein the turn-over assembly comprises:
a transport member configured to transport the at least one element to be fed; and
a turn-over baffle, which is disposed at a side of and spaced apart from the transport member, and is configured to receive the at least one element to be fed falling off the transport member and allow the at least one element to be fed to be turned over.

8. The feeder of claim 7,
wherein a distance between the transport member and the turn-over baffle satisfies: $0.5L<S1<L$, where L is a length of the element to be fed, S1 is a vertical distance from a tangent point of a circular arc at an end of the transport member to a plane of the turn-over baffle.

9. The feeder of claim 7,
wherein an angle between the turn-over baffle and a horizontal plane of the transport member is in the range of $45°\sim60°$.

10. The feeder of claim 1, further comprising: a material tray recovery assembly, which is configured to recover a vacant material tray and to which the fetching assembly is further configured to transport the vacant material tray,
wherein the material tray recovery assembly comprises:
a material tray recovery platform configured to support a plurality of material trays in a stack; and
a material tray recovery support member configured to lift the material trays and allow one and only one of the material trays below the material tray recovery platform to be raised to the material tray recovery platform at a time.

11. The feeder of claim 10,
wherein the material tray recovery assembly further comprises:
a plurality of material tray recovery pillars respectively disposed over an edge of the material tray recovery platform and configured to regulate stacking of the plurality of material trays.

12. The feeder of claim 10,
wherein the material tray recovery support member comprises a pair of flat springs disposed over opposite edges of the material tray recovery platform, the flat springs bounce up or block levelly relative to a plane of the material tray recovery platform according to a position of the material tray so that the material tray is raised from below the material tray recovery platform to the material tray recovery platform.

13. A backlight production apparatus comprising the feeder of claim 1, wherein the element to be fed is a backlight.

* * * * *